US012747504B2

(12) United States Patent
Kaneko et al.

(10) Patent No.: US 12,747,504 B2
(45) Date of Patent: Sep. 29, 2026

(54) SUBSTRATE LIQUID PROCESSING APPARATUS AND SUBSTRATE LIQUID PROCESSING METHOD

(71) Applicant: Tokyo Electron Limited, Tokyo (JP)

(72) Inventors: Satoshi Kaneko, Koshi (JP); Kazuki Motomatsu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/312,482

(22) PCT Filed: Dec. 3, 2019

(86) PCT No.: PCT/JP2019/047182
§ 371 (c)(1),
(2) Date: Jun. 10, 2021

(87) PCT Pub. No.: WO2020/121886
PCT Pub. Date: Jun. 18, 2020

(65) Prior Publication Data
US 2022/0049356 A1 Feb. 17, 2022

(30) Foreign Application Priority Data
Dec. 14, 2018 (JP) ................................ 2018-234603

(51) Int. Cl.
*C23C 18/16* (2006.01)
*C23C 16/455* (2006.01)
(Continued)

(52) U.S. Cl.
CPC ...... *C23C 18/163* (2013.01); *C23C 16/45563* (2013.01); *C23C 16/4584* (2013.01);
(Continued)

(58) Field of Classification Search
CPC ....... C23C 18/38; C23C 18/42; C23C 18/163; C23C 18/1689; C23C 18/1882;
(Continued)

(56) References Cited

U.S. PATENT DOCUMENTS 4,935,604 A * 6/1990 Allen ........................ A61L 2/06
219/400
5,298,465 A * 3/1994 Levy ................... H01J 37/3244
118/620
(Continued)

FOREIGN PATENT DOCUMENTS

JP 09-117101 * 5/1997
JP 2003-073846 A 3/2003
(Continued)

OTHER PUBLICATIONS

International Search Report for PCT/JP2019/047182 dated Feb. 4, 2020.

*Primary Examiner* — Katherine A Bareford
(74) *Attorney, Agent, or Firm* — Chrisman Gallo Tochtrop LLC

(57) ABSTRACT

A substrate liquid processing apparatus includes a substrate holder configured to hold a substrate; a processing liquid supply configured to supply a processing liquid to an upper surface of the substrate held by the substrate holder; a cover body configured to cover the upper surface of the substrate held by the substrate holder; and a gas supply configured to supply an inert gas to a space between the substrate held by the substrate holder and the cover body, the gas supply having a gas supply opening through which the inert gas is discharged. An opening direction of the gas supply opening is directed to a direction other than the upper surface of the substrate held by the substrate holder.

12 Claims, 5 Drawing Sheets

(51) Int. Cl.

| | |
|---|---|
| ***C23C 16/458*** | (2006.01) |
| ***C23C 18/32*** | (2006.01) |
| ***C23C 18/38*** | (2006.01) |
| ***C23C 18/42*** | (2006.01) |

(52) U.S. Cl.
CPC .............. *C23C 18/32* (2013.01); *C23C 18/38* (2013.01); *C23C 18/42* (2013.01)

(58) Field of Classification Search
CPC ..... C23C 18/50; C23C 18/40; C23C 18/1664; C23C 18/32; C23C 18/44; C23C 18/36; C23C 16/4584; C23C 16/45563; H01L 21/67501; H01L 21/304; H10P 52/00; H10P 72/0414
See application file for complete search history.

(56) References Cited

U.S. PATENT DOCUMENTS

2002/0123236 A1* 9/2002 Tanaka .............. H01L 21/67109 438/758
2004/0040177 A1* 3/2004 Izumi ................ H01L 21/67034 34/492
2004/0234696 A1* 11/2004 Hongo .............. H01L 21/76843 427/430.1
2014/0290703 A1* 10/2014 Kobayashi ........ H01L 21/67051 134/33
2015/0147888 A1* 5/2015 Nonaka ............... H01L 21/6708 156/345.21
2016/0093503 A1* 3/2016 Tokuri .............. H01L 21/67028 438/745
2016/0184870 A1* 6/2016 Miura ............... H01L 21/02065 134/33
2017/0117135 A1* 4/2017 Yoshida ............ H01L 21/68742
2017/0148648 A1* 5/2017 Yoshida .............. H01L 21/6719
2018/0002811 A1* 1/2018 Motomatsu ......... C23C 18/1676

FOREIGN PATENT DOCUMENTS

JP 2018-003097 A 1/2018
KR 10-2010-0050119 * 5/2010
WO 2015/146635 A1 10/2015

* cited by examiner

SUBSTRATE LIQUID PROCESSING APPARATUS AND SUBSTRATE LIQUID PROCESSING METHOD

CROSS-REFERENCE TO RELATED APPLICATION

This Application is a U.S. national phase application under 35 U.S.C. § 371 of PCT Application No. PCT/JP2019/047182 filed on Dec. 3, 2019, which claims the benefit of Japanese Patent Application No. 2018-234603 filed on Dec. 14, 2018, the entire disclosures of which are incorporated herein by reference.

TECHNICAL FIELD

The various aspects and exemplary embodiments described herein pertain generally to a substrate liquid processing apparatus and a substrate liquid processing method.

BACKGROUND

In a device and method for performing a liquid processing on a substrate (wafer), an upper surface of a substrate applied with a processing solution may be covered by a cover body.

For example, in an apparatus disclosed in Patent Document 1, a plating liquid on a substrate is heated by a heating member provided at a ceiling member of a cover body in a state where the substrate is covered with the cover body, and, thus, a liquid processing on the substrate is accelerated. Also, in the apparats disclosed in Patent Document 1, a space around the substrate is set in a low oxygen atmosphere by supplying an inert gas to an inside of the cover body, and, thus, oxidation of the plating liquid on the substrate can be suppressed.

If the liquid processing is performed on the substrate under the low oxygen atmosphere in the state where the substrate is covered with the cover body as described above, scattering of a processing liquid on the substrate can be suppressed by the inert gas supplied to the space around the substrate. Thus, the liquid processing can be stably performed.

Patent Document 1: Japanese Patent Laid-open Publication No. 2018-003097

SUMMARY

In one exemplary embodiment, a substrate liquid processing apparatus includes a substrate holder configured to hold a substrate; a processing liquid supply configured to supply a processing liquid to an upper surface of the substrate held by the substrate holder; a cover body configured to cover the upper surface of the substrate held by the substrate holder; and a gas supply configured to supply an inert gas to a space between the substrate held by the substrate holder and the cover body, the gas supply having a gas supply opening through which the inert gas is discharged. An opening direction of the gas supply opening is directed to a direction other than the upper surface of the substrate held by the substrate holder.

DETAILED DESCRIPTION

Hereinafter, a substrate liquid processing apparatus and a substrate liquid processing method will be described. In the substrate liquid processing apparatus and the substrate liquid processing method described below, a plating liquid is used as a processing liquid. However, a liquid other than the plating liquid may be used as the processing liquid configured to process the substrate.

Figure 1:
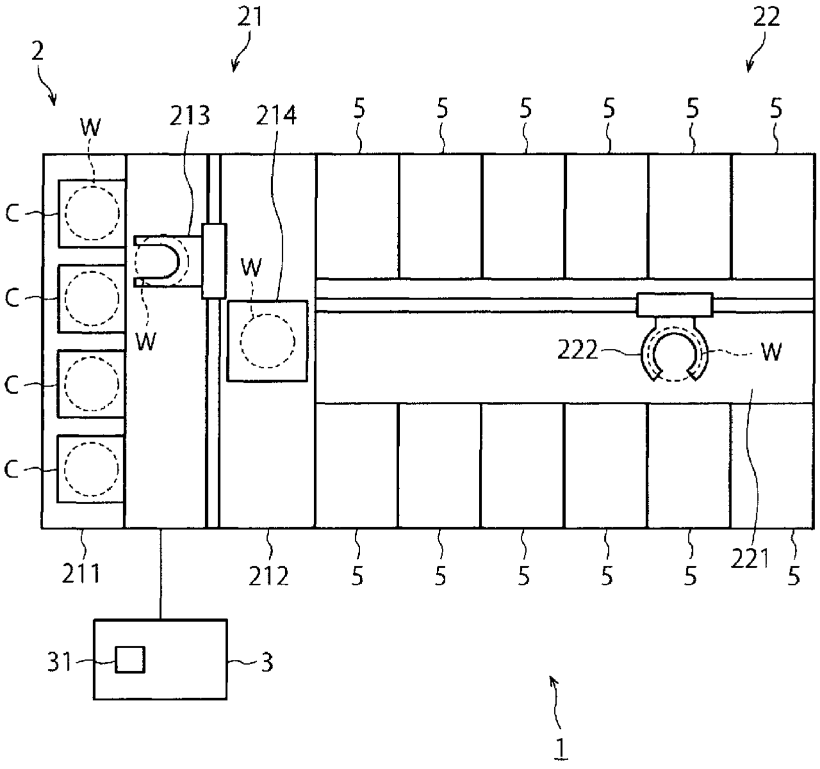
FIG. 1 is a schematic diagram showing a configuration of a plating apparatus as an example of a substrate liquid processing apparatus.

FIG. 1 is a schematic diagram showing a configuration of a plating apparatus as an example of a substrate liquid processing apparatus. Herein, the plating apparatus is an apparatus configured to supply a plating liquid L1 (processing liquid) to a substrate W to perform a plating (liquid processing) on the substrate W.

As shown in FIG. 1, a plating apparatus 1 includes a plating unit 2 and a controller 3 configured to control an operation of the plating unit 2.

The plating unit 2 is configured to perform various processings on the substrate (wafer) W. The processings performed by the plating unit 2 will be described later.

The controller 3 is, for example, a computer, and includes an operation controller and a storage. The operation controller is configured as, for example, a CPU (Central Processing Unit) and configured to control the operation of the plating unit 2 by reading and executing a program stored in the storage. The storage is configured as a storage device such as a RAM (Random Access Memory), a ROM (Read Only Memory) or a hard disk, and stores therein the program for controlling various processings performed in the plating unit 2. Further, the program may be recorded in a computer-readable recording medium 31, or may be installed from the recording medium 31 to the storage. The computer-readable recording medium 31 may be, for example, a hard disc (HD), a flexible disc (FD), a compact disc (CD), a magneto optical disc (MO), or a memory card. The recording medium 31 stores therein a program that, when executed by a computer for controlling an operation of the plating apparatus 1, causes the computer to control the plating apparatus 1 to perform a plating method to be described later.

The plating unit 2 is equipped with a carry-in/out station 21; and a processing station 22 provided adjacent to the carry-in/out station 21.

The carry-in/out station 21 includes a placing section 211 and a transfer section 212 provided adjacent to the placing section 211.

In the placing section 211, a plurality of transfer containers (hereinafter, referred to as "carriers C") each of which accommodates therein a plurality of substrates W horizontally is placed.

The transfer section 212 includes a transfer mechanism 213 and a delivery unit 214. The transfer mechanism 213 includes a holding mechanism configured to hold a substrate W, and is configured to be movable horizontally and vertically and pivotable around a vertical axis.

The processing station 22 includes plating devices 5. In the present exemplary embodiment, the number of plating devices 5 provided in the processing station 22 is two or more, but may be one. The plating devices 5 are arranged on both sides of a transfer path 221 which is extended in a predetermined direction (on both sides in a direction perpendicular to a moving direction of a transfer mechanism 222 to be described later).

The transfer path 221 is provided with the transfer mechanism 222. The transfer mechanism 222 includes a holding mechanism configured to hold a substrate W, and is configured to be movable horizontally and vertically and pivotable around a vertical axis.

In the plating unit 2, the transfer mechanism 213 of the carry-in/out station 21 is configured to transfer the substrate W between the carrier C and the delivery unit 214. Specifically, the transfer mechanism 213 takes out the substrate W from the carrier C placed in the placing section 211, and then, places the substrate W in the delivery unit 214. Further, the transfer mechanism 213 takes out the substrate W which is placed in the delivery unit 214 by the transfer mechanism 222 of the processing station 22, and then, accommodates the substrate W in the carrier C of the placing section 211.

In the plating unit 2, the transfer mechanism 222 of the processing station 22 is configured to transfer the substrate W between the delivery unit 214 and the plating device 5 and between the plating device 5 and the delivery unit 214. Specifically, the transfer mechanism 222 takes out the substrate W placed in the delivery unit 214 and carries the substrate W into the plating device 5. Further, the transfer mechanism 222 takes out the substrate W from the plating device 5 and places the substrate W in the delivery unit 214.

Figure 2:
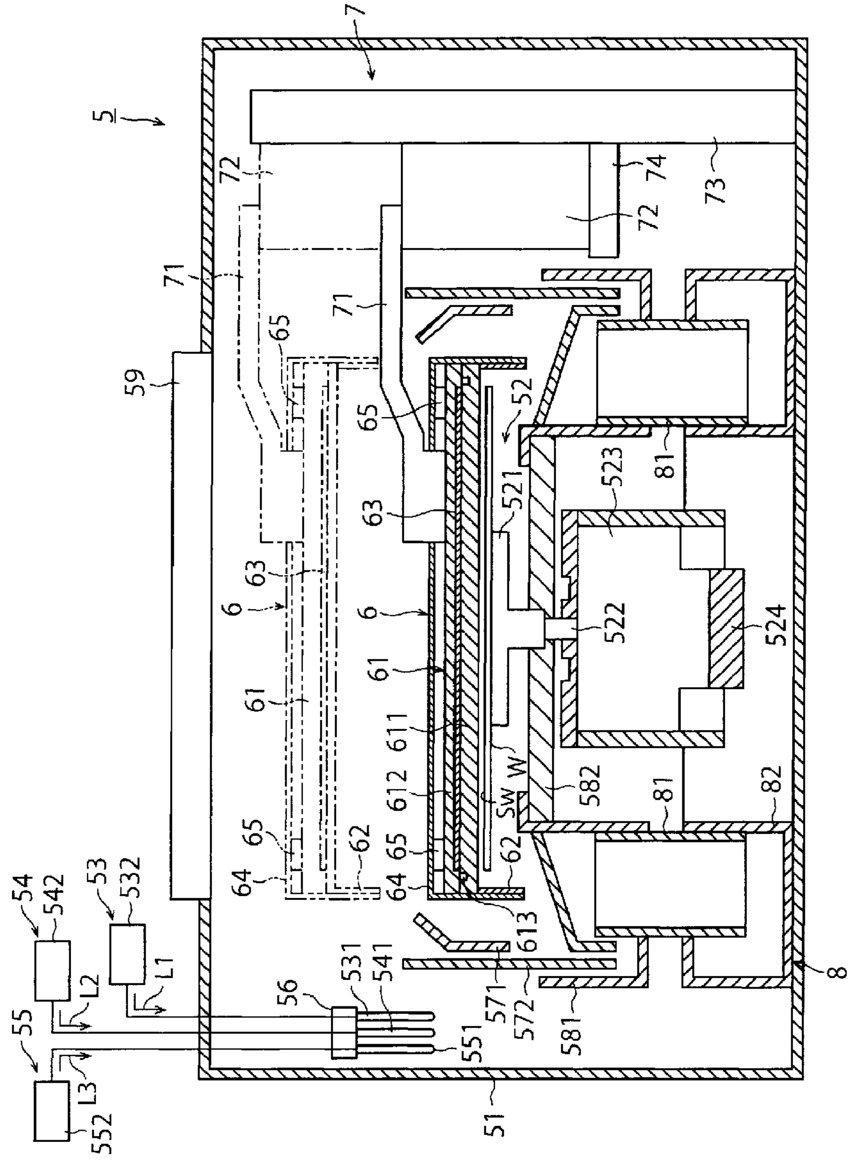
FIG. 2 is a schematic cross-sectional view showing a configuration of a plating device.

Hereinafter, a configuration of the plating device 5 will be described. FIG. 2 is a schematic cross-sectional view showing a configuration of the plating device 5.

The plating device 5 is configured to perform a liquid processing including an electroless plating processing. The plating device 5 is equipped with a chamber 51, a substrate holder 52 provided within the chamber 51 and configured to hold a substrate W horizontally, and a plating liquid supply 53 (processing liquid supply) configured to supply a plating liquid L1 (processing liquid) to an upper surface Sw (processing target surface) of the substrate W held by the substrate holder 52. In the present exemplary embodiment, the substrate holder 52 is equipped with a chuck member 521 configured to vacuum-attract a lower surface (rear surface) of the substrate W. The substrate holder 52 is of a so-called vacuum chuck type, but is not limited thereto. The substrate holder 52 may be of a mechanical chuck type in which an outer periphery portion of the substrate W is held by, for example, a chuck mechanism or the like.

The substrate holder 52 is connected to a rotation motor 523 (rotational driving unit) via a rotation shaft 522. When the rotation motor 523 is driven, the substrate holder 52 is rotated along with the substrate W thereon. The rotation motor 523 is supported at a base 524 fixed to the chamber 51.

The plating liquid supply 53 is equipped with a plating liquid nozzle 531 (processing liquid nozzle) configured to discharge (supply) the plating liquid L1 onto the substrate W held by the substrate holder 52, and a plating liquid source 532 configured to supply the plating liquid L1 to the plating liquid nozzle 531. The plating liquid source 532 is configured to supply the plating liquid L1 heated to or adjusted to have a predetermined temperature to the plating liquid nozzle 531. A temperature of the plating liquid L1 when the plating liquid L1 is discharged from the plating liquid nozzle 531 is, for example, equal to or larger than 55° C. and equal to or smaller than 75° C., and more desirably, equal to or larger than 60° C. and equal to or smaller than 70° C. The plating liquid nozzle 531 is held by a nozzle arm 56 and configured to be movable.

The plating liquid L1 is an autocatalytic (reduction) plating liquid for electroless plating. The plating liquid L1 contains a metal ion such as a cobalt (Co) ion, a nickel (Ni) ion, a tungsten (W) ion, a copper (Cu) ion, a palladium (Pd) ion or a gold (Au) ion, and a reducing agent such as hypophosphorous acid or dimethylamine borane. The plating liquid L1 may further contain an additive or the like. A plating film (metal film) formed by the plating processing with the plating liquid L1 may be, for example, CoWB, CoB, CoWP, CoWBP, NiWB, NiB, NiWP, NiWBP, or the like.

The plating device 5 according to the present exemplary embodiment further includes, as other processing liquid supplies, a cleaning liquid supply 54 configured to supply a cleaning liquid L2 onto the upper surface Sw of the substrate W held by the substrate holder 52, and a rinse liquid supply 55 configured to supply a rinse liquid L3 onto the upper surface Sw of the substrate W.

The cleaning liquid supply 54 is equipped with a cleaning liquid nozzle 541 configured to discharge the cleaning liquid L2 onto the substrate W held by the substrate holder 52, and a cleaning liquid source 542 configured to supply the cleaning liquid L2 to the cleaning liquid nozzle 541. Examples of the cleaning liquid L2 may include an organic acid such as a formic acid, a malic acid, a succinic acid, a citric acid or a malonic acid, or a hydrofluoric acid (DHF) (aqueous solution of hydrogen fluoride) diluted to the extent that it does not corrode a plating target surface of the substrate W. The cleaning liquid nozzle 541 is held by the nozzle arm 56 and configured to be movable along with the plating liquid nozzle 531.

The rinse liquid supply 55 is equipped with a rinse liquid nozzle 551 configured to supply the rinse liquid L3 onto the substrate W held by the substrate holder 52, and a rinse liquid source 552 configured to supply the rinse liquid L3 to the rinse liquid nozzle 551. The rinse liquid nozzle 551 is held by the nozzle arm 56 and configured to be movable along with the plating liquid nozzle 531 and the cleaning liquid nozzle 541. Examples of the rinse liquid L3 may include pure water or the like.

The nozzle arm 56 holding the above-described plating liquid nozzle 531, cleaning liquid nozzle 541 and rinse liquid nozzle 551 is connected to a non-illustrated nozzle moving mechanism. The nozzle moving mechanism is configured to move the nozzle arm 56 horizontally and vertically. More specifically, the nozzle arm 56 is configured to be movable by the nozzle moving mechanism between a discharge position where the processing liquid (plating liquid L1, cleaning liquid L2 or rinse liquid L3) is discharged onto the substrate W and a retreat position retreated from the discharge position. The discharge position is not particularly limited as long as the processing liquid can be supplied onto a certain position on the upper surface Sw of the substrate W. For example, desirably, the discharge position is set to a position where the processing liquid can be supplied to a center of the substrate W. The discharge position of the nozzle arm 56 may be set differently in the individual cases of supplying the plating liquid L1, supplying the cleaning liquid L2 and supplying the rinse liquid L3 to the substrate W. The retreat position is a position within the chamber 51 which does not overlap with the substrate W when viewed from above and is spaced apart from the discharge position. When the nozzle arm 56 is located at the retreat position, it is possible to avoid interference between a cover body 6 being moved and the nozzle arm 56.

A cup 571 is disposed around the substrate holder 52. The cup 571 is formed into a ring shape when viewed from above and configured to receive the processing liquid scattered from the substrate W when the substrate W is being rotated and configured to guide the received processing liquid to a drain duct 581 to be described later. An atmosphere blocking cover 572 is provided at an outer peripheral side of the cup 571 and configured to suppress diffusion of the ambient atmosphere around the substrate W in the chamber 51. The atmosphere blocking cover 572 is formed into a vertically extending cylindrical shape and has an open top. The cover body 6 to be descried later can be inserted into the atmosphere blocking cover 572 from above.

The drain duct 581 is provided under the cup 571. The drain duct 581 is formed into a ring shape when viewed from above, and serves to drain the processing liquid falling down after being received by the cup 571 and the processing liquid directly falling down from the vicinity of the substrate W. An inner cover 582 is provided at an inner periphery side of the drain duct 581.

The upper surface Sw of the substrate W held by the substrate holder 52 is covered with the cover body 6. The cover body 6 has a ceiling member 61 extended horizontally, and a sidewall member 62 extended downwards from the ceiling member 61. The ceiling member 61 is located above the substrate W held by the substrate holder 52 when the cover body 6 is located at a lower position (i.e., a processing position) to be described later, and faces the substrate W with a relatively small gap therebetween.

The ceiling member 61 includes a first ceiling plate 611 and a second ceiling plate 612 provided on the first ceiling plate 611. A heater 63 (heating unit) is interposed between the first ceiling plate 611 and the second ceiling plate 612. The first ceiling plate 611 and the second ceiling plate 612 are provided as a first planar body and a second planar body with the heater 63 interposed therebetween. The first ceiling plate 611 and the second ceiling plate 612 are configured to seal the heater 63 such that the heater 63 is not brought into contact with the processing liquid such as the plating liquid L1. More specifically, a seal ring 613 is provided at an outer peripheral side of the heater 63 between the first ceiling plate 611 and the second ceiling plate 612, and the heater 63 is sealed by the seal ring 613. Desirably, the first ceiling plate 611 and the second ceiling plate 612 have corrosion resistance against the processing liquid such as the plating liquid L1, and may be made of, for example, an aluminum alloy. Further, to improve the corrosion resistance, the first ceiling plate 611, the second ceiling plate 612 and the sidewall member 62 may be coated with Teflon (registered trademark).

The cover body 6 is connected to a cover body moving mechanism 7 via a cover body arm 71. The cover body moving mechanism 7 is configured to move the cover body 6 horizontally and vertically. More specifically, the cover body moving mechanism 7 is equipped with a rotation motor 72 configured to move the cover body 6 horizontally and a cylinder 73 (gap adjusting unit) configured to move the cover body 6 vertically. The rotation motor 72 is provided on a supporting plate 74 configured to be movable up and down with respect to the cylinder 73. Here, instead of the cylinder 73, an actuator (not shown) including a motor and a ball screw may be used.

The rotation motor 72 of the cover body moving mechanism 7 is configured to move the cover body 6 between an upper position located above the substrate W held by the substrate holder 52 and a retreat position retreated from the upper position. The upper position is a position facing the substrate W, which is held by the substrate holder 52, with a relatively large gap therebetween and overlapping with the substrate W when viewed from above. The retreat position is a position within the chamber 51 which does not overlap with the substrate W when viewed from above. When the cover body 6 is located at the retreat position, it is possible to avoid the interference between the nozzle arm 56 being moved and the cover body 6. A rotation axis of the rotation motor 72 is vertically extended, and the cover body 6 is configured to be pivotable horizontally between the upper position and the retreat position.

The cylinder 73 of the cover body moving mechanism 7 is configured to move the cover body 6 up and down and adjust the distance between the first ceiling plate 611 of the ceiling member 61 and the upper surface Sw of the substrate W on which the plating liquid L1 is accumulated. More specifically, the cylinder 73 locates the cover body 6 at the lower position (indicated by a solid line in FIG. 2) and the upper position (indicated by a dashed double-dotted line in FIG. 2).

When the cover body 6 is placed at the lower position, the first ceiling plate 611 comes close to the substrate W. In this case, in order to suppress contamination and loss of the plating liquid L1 or to suppress generation of bubbles in the plating liquid L1, the lower position is set such that the first ceiling plate 611 is not brought into contact with the plating liquid L1 on the substrate W.

The upper position is set to a position where it is possible to avoid interference of the cover body 6 with the ambient structures such as the cup 571 and the atmosphere blocking cover 572 when the cover body 6 is pivoted horizontally.

In the present exemplary embodiment, the heater 63 (heating unit) is driven to generate heat. When the cover body 6 is located at the above-described lower position, the plating liquid L1 on the substrate W is heated by the heater 63.

The sidewall member 62 of the cover body 6 is extended downwards from a periphery of the first ceiling plate 611 of the ceiling member 61 and located at an outer peripheral side of the substrate W when the plating liquid L1 on the substrate W is heated (i.e., when the cover body 6 is located at the lower position). When the cover body 6 is placed at the lower position, a lower end of the sidewall member 62 may be located at a position lower than the substrate W.

The heater 63 provided in the ceiling member 61 generates the heat and heats the processing liquid (appropriately, the plating liquid L1) on the substrate W when the cover body 6 is located at the lower position.

The ceiling member 61 and the sidewall member 62 of the cover body 6 are covered by a cover body cover 64. The cover body cover 64 is provided on the second ceiling plate 612 of the cover body 6 with supporting members 65 therebetween. That is, a plurality of supporting members 65 protruded upwards from an upper surface of the second ceiling plate 612 is provided on the second ceiling plate 612, and the cover body cover 64 is placed on these supporting members 65. The cover body cover 64 is configured to be movable horizontally and vertically along with the cover body 6. Further, it is desirable that the cover body cover 64 has higher thermal insulation property than the ceiling member 61 and the sidewall member 62 to suppress a leakage of the heat within the cover body 6 to the vicinity thereof. For example, desirably, the cover body cover 64 may be made of a resin material. More desirably, the resin material has thermal resistance.

A fan filter unit 59 (gas supply) configured to supply clean air (gas) around the cover body 6 is provided at a top portion of the chamber 51. The fan filter unit 59 supplies air into the chamber 51 (particularly, into the atmosphere blocking cover 572), and the supplied air flows toward an exhaust line 81 to be described later. A downflow of this air is formed around the cover body 6, and a gas vaporized from the processing liquid such as the plating liquid L1 flows toward the exhaust line 81 along with this downflow. Accordingly, it is possible to suppress the rise and diffusion of the gas vaporized from the processing liquid within the chamber 51.

The gas supplied from the fan filter unit 59 is exhausted by a gas exhaust mechanism 8. The gas exhaust mechanism 8 is equipped with two exhaust lines 81 provided under the cup 571 and an exhaust duct 82 provided under the drain duct 581. The two exhaust lines 81 penetrate a bottom portion of the drain duct 581 and individually communicate with the exhaust duct 82. The exhaust duct 82 is formed into a substantially semi-circular ring shape when viewed from above. In the present exemplary embodiment, the single exhaust duct 82 is provided under the drain duct 581 and the two exhaust lines 81 communicate with this exhaust duct 82.

[Gas Supply]

Although not shown in FIG. 2, a gas supply having one or more gas supply openings through which an inert gas is discharged is further included in the plating device 5 (see reference numeral 11 in FIG. 3 to FIG. 6). The gas supply is configured to supply the inert gas to a space between the substrate W held by the substrate holder 52 and the cover body 6, so that the atmosphere around the substrate W is turned into a low oxygen atmosphere.

The gas supply opening is typically located inside the cover body 6. Particularly, in the present exemplary embodiment, an opening direction of the gas supply opening is directed to a direction other than the upper surface Sw of the substrate W held by the substrate holder 52. Therefore, the inert gas immediately after being discharged from the gas supply opening proceeds toward the direction other than the upper surface Sw, and, thus, it is possible to suppress a direct discharge of the inert gas to the upper surface Sw. Accordingly, it is possible to supply the inert gas to the space between the substrate W and the cover body 6 while suppressing a temperature decrease and a state turbulence of the plating liquid L1 on the upper surface Sw. As described above, the plating device 5 including the gas supply can stably perform the liquid processing on the substrate W while supplying the inert gas around the substrate W.

Further, the opening direction of the gas supply opening is determined depending on a direction in which a center line of a gas flow path extended to the gas supply opening faces at the gas supply opening. Therefore, most of the inert gas discharged from the gas supply opening through the gas flow path proceeds in the opening direction or in a direction including the opening direction component.

In order to suppress oxidation of the processing liquid (for example, the plating liquid L1) on the substrate W, it is desirable not to increase the amount of oxygen contained in the processing liquid (i.e., the amount of dissolved oxygen). Meanwhile, the amount of dissolved oxygen in the processing liquid on the substrate W changes depending on a ratio or a partial pressure of the oxygen in the gas existing in the space facing the upper surface Sw. To reduce the amount of dissolved oxygen in the processing liquid, it is desirable to lower the ratio of the oxygen in the space. According to the plating device 5 of the present exemplary embodiment, the inert gas is supplied to the space between the substrate W and the cover body 6, and the space is set in a positive pressure state, and, thus, the oxygen existing in the space is discharged to the outside of the space. By lowering the ratio of the oxygen in the space between the substrate W and the cover body 6 as described above, it is possible to facilitate deaeration of the processing liquid and reduce the amount of dissolved oxygen in the processing liquid.

Herein, the inert gas may include any gas having low reactivity, and may be a gas of only one element or may be a gas of a compound. Typically, nitrogen, rare gases (such as helium), and other stable gases without containing oxygen may be used as the inert gas. Particularly, helium is more desirable than nitrogen for the following reasons and can be used as the inert gas.

Helium is lighter than nitrogen and oxygen and thus can be easily accumulated in an inside space of the cover body 6 (i.e., a space defined by the ceiling member 61 and the sidewall member 62). Particularly, when a gas is guided and discharged downwards through the exhaust line 81 and the exhaust duct 82 (see FIG. 2) as described above, helium is less likely to be discharged than nitrogen and oxygen. Therefore, helium can be more effectively used than nitrogen to reduce the ratio of the oxygen in the space between the substrate W and the cover body 6 while suppressing the consumption amount thereof. Further, helium has a thermal conductivity about 5 times higher than that of nitrogen and thus can be easily increased in temperature. A temperature decrease of the processing liquid on the substrate W, which is heated by the heater 63 as described above, caused by the influence of the inert gas existing in the space between the substrate W and the cover body 6 is not desirable. By supplying helium, which can be easily increased in temperature by the heat from the heater 63, as the inert gas to the space between the substrate W and the cover body 6, it is possible to effectively suppress the temperature decrease of the processing liquid on the substrate W. Helium also has a lower solubility than oxygen and nitrogen. In general, mixing of foreign materials into the processing liquid is not desirable. Therefore, it is desirable not to dissolve even the inert gas, which is considered to have almost no bad influence, in the processing liquid if possible. Therefore, when helium is supplied as the inert gas to the space between the substrate W and the cover body 6, it is possible to suppress the dissolution of the inert gas (i.e., helium) in the processing liquid on the substrate W. Helium is also safer and easier to handle than nitrogen.

The gas supply can be implemented in various configurations, and the inert gas can be discharged from the gas supply opening in various aspects. Hereinafter, exemplary configurations of the gas supply and exemplary aspects of discharging the inert gas will be described.

First Example of Gas Supply

Figure 3:
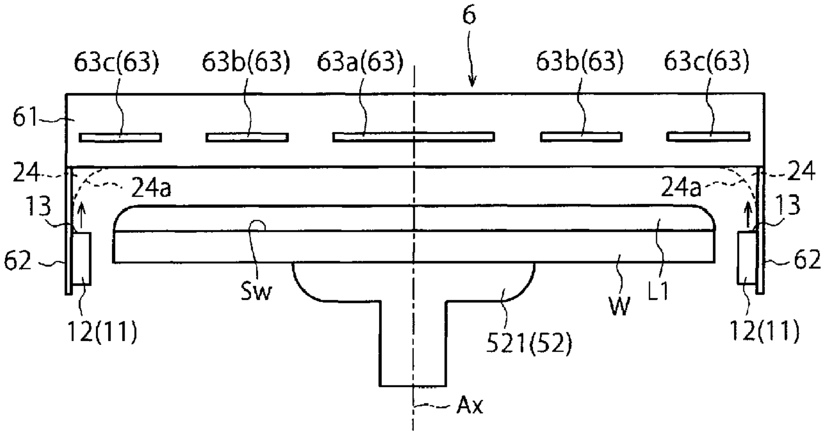
FIG. 3 is a cross-sectional view showing a schematic configuration of a gas supply according to a first example.

FIG. 3 is a cross-sectional view showing a schematic configuration of a gas supply 11 according to a first example. In FIG. 3, components identical or similar to those explained above with reference to FIG. 1 and FIG. 2 will be assigned identical reference numerals, and explanation thereof will be omitted. For facilitating the understanding, the shapes and dimensional ratios of the components shown in FIG. 3 do not necessarily match with the shapes and dimensional ratios of the components shown in FIG. 1 and FIG. 2. Also, an illustration of some components (for example, the cover body cover 64) is omitted in FIG. 3.

The gas supply 11 includes a gas supply nozzle 12 having a gas supply opening 13 and a gas source (not shown) configured to supply the inert gas to the gas supply nozzle 12. The controller 3 (see FIG. 1) adjusts a supply of the inert gas to the gas supply nozzle 12 and a discharge of the inert gas from the gas supply opening 13 by controlling the gas supply source and/or a flow rate control device (for example, an opening/closing valve) provided in a flow path extended from the gas supply source to the gas supply nozzle 12.

The gas supply nozzle 12 of the gas supply 11 of the present example is provided on the inside of the sidewall member 62 of the cover body 6 (i.e., on the substrate holder 52 side), and the opening direction of the gas supply opening 13 is directed to the ceiling member 61. Therefore, the gas supply opening 13 discharges the inert gas toward the ceiling member 61.

In the example shown in FIG. 3, a plurality of gas supply nozzles 12 is provided and two gas supply nozzles 12 are arranged at symmetrical positions (i.e., line symmetrical positions) with respect to a rotation axis Ax of the substrate W. Also, the number of gas supply nozzles 12 may be only two, or may be three or more, or may be only one. If a plurality of gas supply nozzles 12 is provided, the plurality of gas supply nozzles 12 may be arranged at rotation symmetrical positions with respect to the rotation axis Ax.

The illustrated heater 63 is divided into a plurality of parts according to a horizontal distance from the rotation axis Ax. Specifically, a central heater 63*a* is located in a central zone around the rotation axis Ax, an outermost heater 63*c* is located farthest from the rotation axis Ax, and an intermediate heater 63*b* is located between the central heater 63*a* and the outermost heater 63*c*. By allocating the respective heaters 63*a*, 63*b* and 63*c* to the plurality of zones as described above, it is possible to adjust heating of the plating liquid L1 for each unit zone. For example, a temperature around the outer periphery of the substrate W is prone to decrease, and, thus, the outermost heater 63*c* is set to have a higher temperature than the other heaters. Therefore, it is possible to suppress a local temperature decrease of the plating liquid L1 on the upper surface Sw around the outer periphery of the substrate W.

As described above, the temperature decrease of the plating liquid L1 on the substrate W caused by the inert gas existing in the space between the cover body 6 and the substrate W is not desirable. Meanwhile, the inert gas is discharged from the gas supply opening 13 of the present example toward the zone corresponding to the outermost heater 63*c* in the ceiling member 61. Therefore, when the outermost heater 63*c* is set to have a higher temperature than the other heaters, the inert gas discharged from the gas supply opening 13 can be effectively increased in temperature. Thus, it is possible to suppress the temperature decrease of the plating liquid L1 on the substrate W caused by the inert gas.

An airflow guide member 24 may be provided at a corner between the ceiling member 61 and the sidewall member 62. The illustrated airflow guide member 24 is provided over the entire corner between the ceiling member 61 and the sidewall member 62, and has a guide surface 24*a* formed as a smooth curved surface exposed to the space between the cover body 6 and the substrate W. Desirably, the guide surface 24*a* is continuous to an inner surface of the ceiling member 61 and/or an inner surface of the sidewall member 62 without a step, and forms a smooth surface together with the inner surface of the ceiling member 61 and the inner surface of the sidewall member 62. Since the airflow guide member 24 is provided, it is possible to suppress occurrence of a vortex at the corner between the ceiling member 61 and the sidewall member 62, and suppress stagnation of the gas at the corner.

Desirably, the opening direction of the gas supply opening 13 is directed to the guide surface 24*a* of the airflow guide member 24. In this case, the gas supply opening 13 discharges the inert gas toward the guide surface 24*a* of the airflow guide member 24 and a flow direction of the inert gas is changed to the horizontal direction by the guide surface 24*a*. Thus, it is possible to allow the inert gas to flow in the horizontal direction along the inner surface of the ceiling member 61. Accordingly, it is possible to allow the inert gas to flow above the substrate while suppressing the discharge of the inert gas onto the plating liquid L1 on the substrate W. Particularly, by providing the plurality of gas supply nozzles 12 (i.e., a plurality of gas supply openings 13) and allowing the inert gas to flow along the inner surface of the ceiling member 61, it is possible to form a laminar flow of the inert gas flowing in the horizontal direction around the liquid surface of the plating liquid L1 on the substrate W. That is, it is possible to form, on the ceiling member 61 side, a laminar flow of the inert gas from the outer peripheral side of the substrate W toward the inside of the substrate W and form, on the substrate W side, a laminar flow of the inert gas from the inside of the substrate W toward the outer peripheral side of the substrate W. In this case, it is possible to efficiently exhaust an oxygen-containing gas released from the plating liquid L1 to the outside of the cover body 6 by allowing the oxygen-containing gas to be swept away by the laminar flow of the inert gas from the inside toward the outer periphery of the substrate W.

Further, in order to form an airflow that smoothly flows in the horizontal direction along the inner surface of the ceiling member 61, it is desirable that the inner surface of the ceiling member 61 is a flat surface without irregularities. Likewise, in order to form an airflow that smoothly flows in the vertical direction along the inner surface of the sidewall member 62, it is desirable that the inner surface of the sidewall member 62 is a flat surface without irregularities.

Second Example of Gas Supply

Figure 4:
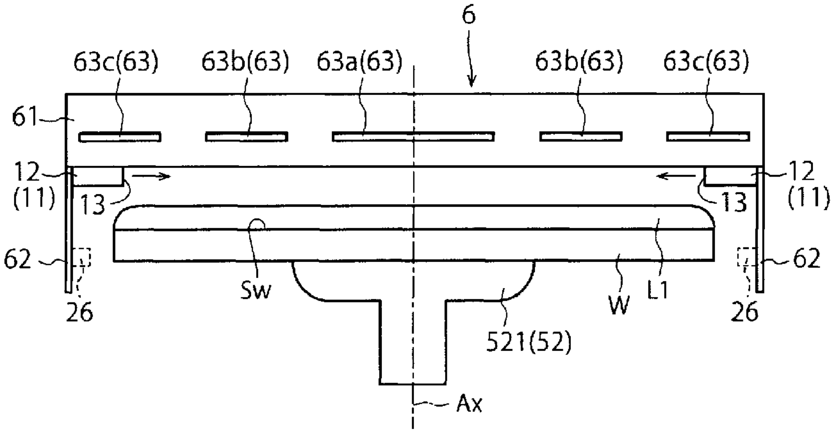
FIG. 4 is a cross-sectional view showing a schematic configuration of a gas supply according to a second example.

FIG. 4 is a cross-sectional view showing a schematic configuration of a gas supply 11 according to a second example. In FIG. 4, components identical or similar to those explained above with reference to FIG. 1 to FIG. 3 will be assigned identical reference numerals, and explanation thereof will be omitted. The shapes and dimensional ratios of the components shown in FIG. 4 do not necessarily match with the shapes and dimensional ratios of the components shown in FIG. 1 and FIG. 2. Also, an illustration of some components is omitted in FIG. 4.

In the present example, a plurality of gas supply nozzles 12 of the gas supply 11 is provided at the inner surface of the ceiling member 61 of the cover body 6 (i.e., on the substrate holder 52 side). These gas supply nozzles 12 are arranged at rotation symmetrical positions with respect to the rotation axis Ax. In the illustrated example, two gas supply nozzles 12 are arranged at the line symmetrical positions with respect to the rotation axis Ax.

The opening direction of each gas supply opening 13 is the horizontal direction, and each gas supply opening 13 discharges the inert gas so as to flow along the ceiling member 61. The opening direction of the illustrated gas supply opening 13 is directed from the outer peripheral side of the substrate W toward the inside of the substrate W so as to pass through the rotation axis Ax, and the gas supply opening 13 is directed to the rotation axis Ax. If the gas supply opening 13 can discharge the inert gas so as to flow along the ceiling member 61, the gas supply nozzles 12 may be provided only at the sidewall member 62 instead of the ceiling member 61 or may be provided at both the ceiling member 61 and the sidewall member 62.

With the gas supply nozzle 12 of the present example having the above-described configuration, the inert gas discharged from the gas supply opening 13 proceeds toward the inside of the substrate W from the outer peripheral side of the substrate W along the ceiling member 61 and collides with the inert gas flowing from another direction near the rotation axis Ax. Then, the inert gas proceeds from the inside of the substrate W toward the outer peripheral side along the liquid surface of the plating liquid L1, passes through the space between the substrate W and the cover body 6 (particularly, the sidewall member 62), and is discharged to the outside of the cover body 6.

A flange 26 extended from the sidewall member 62 toward the inside (i.e., the substrate holder 52 side) may be provided at the sidewall member 62. The flange 26 shown in FIG. 4 is provided as an annular protrusion and attached to the inner surface of the sidewall member 62. In the state where the cover body 6 is located at the lower position, the flange 26 locally reduces a horizontal cross-sectional area of the space between the substrate W and the cover body 6 and is located at a position lower than, for example, the upper surface Sw of the substrate W. In the illustrated example, the flange 26 is provided at a position that at least partially overlaps the substrate W in the horizontal direction, but may be provided at a position that does not overlap the substrate W in the horizontal direction (i.e., at a position below the entire substrate W). The flange 26 can suppress an inflow of air (particularly, oxygen) into the space between the cover body 6 and the substrate W and stabilize the plating liquid L1 on the substrate W. Further, the flange 26 makes it easier to set a pressure in the space between the cover body 6 and the substrate W to be positive, and contributes to the effective exhaust of the gas such as oxygen from the space.

Third Example of Gas Supply

Figure 5:
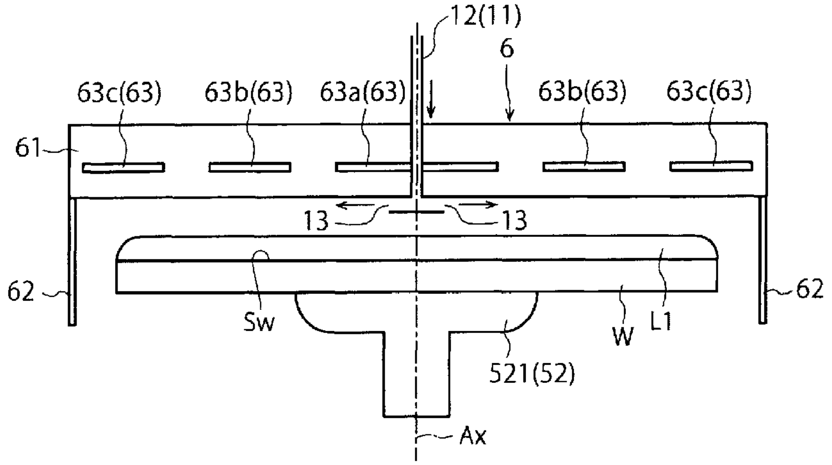
FIG. 5 is a cross-sectional view showing a schematic configuration of a gas supply according to a third example.

FIG. 5 is a cross-sectional view showing a schematic configuration of a gas supply 11 according to a third example. In FIG. 5, components identical or similar to those explained above with reference to FIG. 1 to FIG. 4 will be assigned identical reference numerals, and explanation thereof will be omitted. The shapes and dimensional ratios of the components shown in FIG. 5 do not necessarily match with the shapes and dimensional ratios of the components shown in FIG. 1 and FIG. 2. Also, an illustration of some components is omitted in FIG. 5.

The gas supply nozzle 12 of the gas supply 11 of the present example is provided in the ceiling member 61 of the cover body 6. The illustrated gas supply nozzle 12 has a vertical flow path that penetrates the ceiling member 61 along the rotation axis Ax, and a horizontal flow path that is connected to the vertical flow path and extended inside the cover body 6 in the horizontal direction, and the gas supply opening 13 is formed by an end opening of the horizontal flow path. The illustrated gas supply opening 13 is formed by a single opening along a circumferential direction. Also, one or more partitions may be provided in the horizontal flow path, and a plurality of gas supply openings 13 may be formed by a plurality of openings separated from each other by the one or more partitions.

The opening direction of the gas supply opening 13 is the horizontal direction from the inside of the substrate W toward the outer peripheral side of the substrate W. The inert gas discharged from the gas supply opening 13 proceeds radially from the inside of the substrate W toward the outer peripheral side of the substrate W, passes through the space between the substrate W and the cover body 6 (particularly, the sidewall member 62), and is exhausted to the outside of the cover body 6. Accordingly, it is possible to discharge the oxygen-containing gas to the outside of the cover body 6 together with the inert gas flowing from the inside of the substrate W to the outside thereof.

Although not illustrated in FIG. 5, the airflow guide member 24 (see FIG. 3) and/or the flange 26 (see FIG. 4) described above may also be provided in the present example.

Fourth Example of Gas Supply

Figure 6:
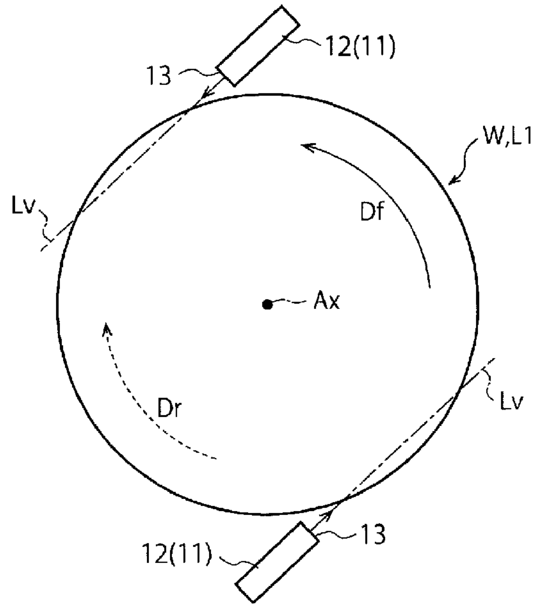
FIG. 6 is a plan view showing a schematic configuration of a gas supply according to a fourth example.

FIG. 6 is a plan view showing a schematic configuration of a gas supply 11 according to a fourth example. In FIG. 6, components identical or similar to those explained above with reference to FIG. 1 to FIG. 5 will be assigned identical reference numerals, and explanation thereof will be omitted. The shapes and dimensional ratios of the components shown in FIG. 6 do not necessarily match with the shapes and dimensional ratios of the components shown in FIG. 1 and FIG. 2. Also, an illustration of some components is omitted in FIG. 6.

The substrate holder 52 of the present example rotates the substrate W in a forward circumferential direction Df around the rotation axis Ax in the state where the cover body 6 is located at the lower position (i.e., the processing position). By rotating the substrate W with the plating liquid L1 placed on the upper surface Sw at a low speed, it is possible to suppress local bias in the amount of the plating liquid L1 while maintaining the state of the plating liquid L1 on the upper surface Sw and perform the uniform liquid processing throughout the upper surface Sw.

The gas supply 11 is equipped with a plurality of gas supply nozzles 12 (two gas supply nozzles 12 in the example shown in FIG. 6) and a plurality of gas supply openings 13. As an extension line Lv that passes through the center of the gas supply opening 13 of each gas supply nozzle 12, an extension line Lv extended linearly in the opening direction of the gas supply opening 13 is virtually set. The opening direction of each gas supply opening 13 is set such that the extension line Lv does not pass through the rotation axis Ax and follows the forward circumferential direction Df. That is, the opening direction of each gas supply opening 13 is set such that the inert gas discharged from each gas supply opening 13 forms an airflow circling along the forward circumferential direction Df above the substrate W.

In the example shown in FIG. 6, each gas supply nozzle 12 is provided outside the outer periphery of the substrate W, and each gas supply nozzle 12 (especially, each gas supply opening 13) does not overlap the substrate W in the vertical direction. The gas supply nozzle 12 (particularly, the gas supply opening 13) may be located inside the outer periphery of the substrate W, or may overlap the substrate W in the vertical direction. For example, in the gas supply nozzles 12 each having the vertical flow path and the horizontal flow path, a plurality of gas supply openings 13 formed by the end openings of the horizontal flow paths may be located inside the outer periphery of the substrate W (not shown). The vertical flow path is provided so as to penetrate the ceiling member 61 in parallel with the rotation axis Ax (for example, along the rotation axis Ax), and the horizontal flow path is connected to the vertical flow path and located in the space inside the cover body 6. In this case as well, the opening direction of each gas supply opening 13 is set such that the extension line Lv does not pass through the rotation axis Ax and follows the forward circumferential direction Df, and, thus, it is possible to form the airflow circling along the forward circumferential direction Df above the substrate W.

As described above, a circling direction of the airflow above the substrate W is set to correspond to the rotation direction of the substrate W, and, thus, it is possible to reduce the relative speed between the plating liquid L1 on the substrate W and the airflow above the substrate W. Accordingly, it is possible to suppress the influence of the inert gas supplied to the space between the cover body 6 and the substrate W upon the plating liquid L1 on the substrate W and stabilize the state of the plating liquid L1 on the substrate W.

The opening direction of each gas supply opening 13 may be set such that the extension line Lv does not pass through the rotation axis Ax and follows a circumferential direction (i.e., a reverse circumferential direction) Dr opposite to the forward circumferential direction Df. In this case, the opening direction of each gas supply opening 13 is set such that the inert gas discharged from each gas supply opening 13 forms an airflow circling along the reverse circumferential direction Dr above the substrate W. In this case, in the state where the relative speed between the plating liquid L1 on the substrate W and the circling airflow above the substrate W is relatively high, the oxygen-containing gas can be effectively discharged from the space between the substrate W and the cover body 6 by the circling airflow. Further, the opening direction of each gas supply opening 13 may be set such that the circling airflow is formed above the substrate W in the state where the substrate W is stopped by the substrate holder 52.

In order to form a desired circling airflow above the substrate W, it is desirable that the opening directions of the gas supply openings 13 of all the gas supply nozzles 12 follow a common circumferential direction (i.e., the forward circumferential direction Df or the reverse circumferential direction Dr). However, the opening directions of the gas supply openings 13 of only some of the gas supply nozzles 12 may be set to follow the common circumferential direction. That is, the opening directions of two or more of the plurality of gas supply openings 13 may be set to follow one of the forward circumferential direction Df and the reverse circumferential direction Dr.

Fifth Example of Gas Supply

Figure 7:
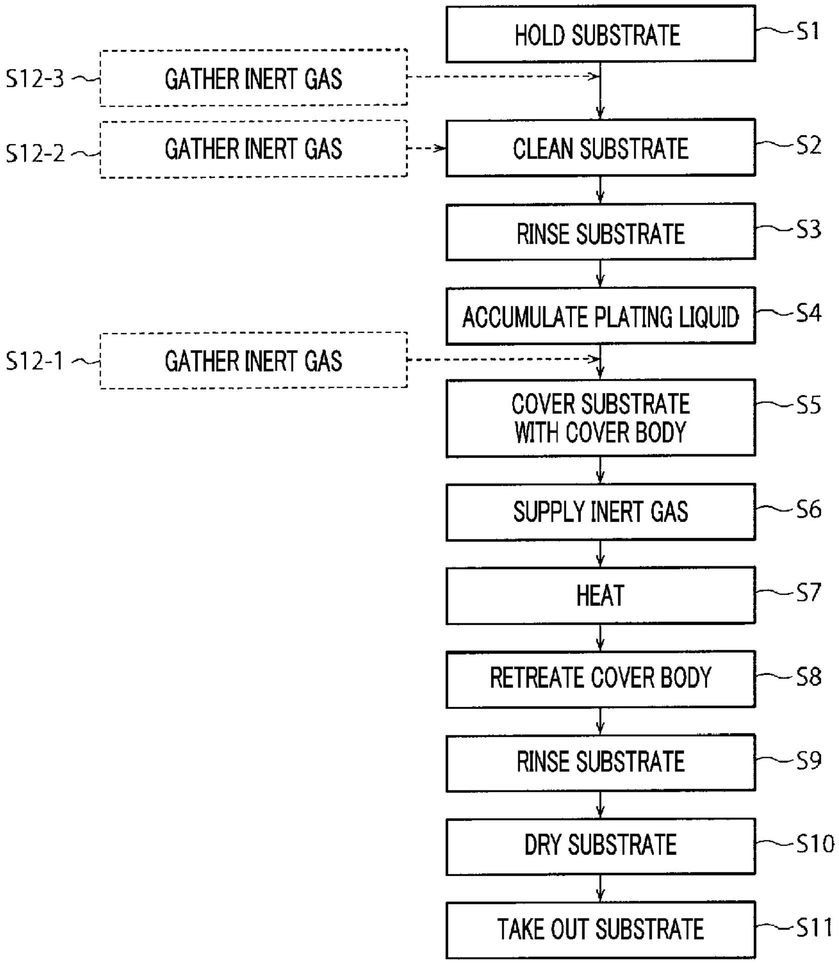
FIG. 7 is a flowchart showing an example of a plating method.

FIG. 7 is a flowchart showing an example of a plating method. The present example relates to a plating method (i.e., a substrate liquid processing method), and particularly relates to a timing of discharging the inert gas from the gas supply opening 13. Therefore, the plating method according to the present example may be performed by, for example, the apparatus according to the first to fourth examples described above, or may be performed by an apparatus having another configuration.

Hereinafter, the overall flow of the plating method will be described first, and then the supply timing of the inert gas will be described.

The plating method performed by the plating apparatus 1 includes the plating processing on the substrate W. The plating processing is performed by the plating device 5. An operation of the plating device 5 to be described below is controlled by the controller 3. Further, while the following processing is being performed, the clean air is supplied into the chamber 51 from the fan filter unit 59 and flows toward the exhaust line 81.

First, the substrate W is carried into the plating device 5 and is horizontally held by the substrate holder 52 (S1 shown in FIG. 7).

Then, a cleaning processing is performed on the substrate W held by the substrate holder 52 (S2). In this cleaning processing, the rotation motor 523 is first driven to rotate the substrate W at a predetermined rotational speed. Subsequently, the nozzle arm 56 located at the retreat position is moved to the discharge position, and the cleaning liquid L2 is supplied from the cleaning liquid nozzle 541 onto the upper surface Sw of the substrate W being rotated. Thus, the surface of the substrate W is cleaned and the deposits adhering to the substrate W are removed from the substrate W. The cleaning liquid L2 supplied to the substrate W is drained into the drain duct 581.

Subsequently, a rinsing processing is performed on the substrate W (S3). In this rinsing processing, the rinse liquid L3 is supplied from the rinse liquid nozzle 551 onto the substrate W being rotated. Thus, the surface of the substrate W is rinsed, and the cleaning liquid L2 remaining on the substrate W is washed away. The rinse liquid L3 supplied to the substrate W is drained into the drain duct 581.

Thereafter, a plating liquid accumulating process in which the plating liquid L1 is supplied onto the upper surface Sw of the substrate W held by the substrate holder 52 to form a puddle of the plating liquid L1 on the upper surface Sw of the substrate W is performed (S4). In this process, first, the rotational speed of the substrate W is reduced lower than the rotational speed of the substrate W in the rinsing processing. For example, the rotational speed of the substrate W may be set to from 50 rpm to 150 rpm. Accordingly, the plating film formed on the substrate W can be made uniform. Further, the rotation of the substrate W may be stopped to increase an accumulation amount of the plating liquid L1. Then, the plating liquid L1 is discharged from the plating liquid nozzle 531 onto the upper surface Sw of the substrate W. The plating liquid L1 stays on the upper surface Sw due to the surface tension, and a layer (so-called puddle) of the plating liquid L1 is formed. A part of the plating liquid L1 flows off the upper surface Sw to be drained through the drain duct 581. After a predetermined amount of the plating liquid L1 is discharged from the plating liquid nozzle 531, the discharge of the plating liquid L1 is stopped. Then, the nozzle arm 56 is returned back to the retreat position.

Then, as a plating liquid heating process, the plating liquid L1 accumulated on the substrate W is heated. This plating liquid heating process includes a process of covering the substrate W with the cover body 6 (S5), a process of supplying the inert gas (S6), a heating process of placing the cover body 6 at the lower position and heating the plating liquid L1 (S7) and a process of retreating the cover body 6 from above the substrate W (S8). Also, in this plating liquid heating process as well, it is desirable to maintain the rotational speed of the substrate W equal to that in the plating liquid accumulating process (or to stop the rotation of the substrate W).

In the process of covering the substrate W with the cover body 6 (S5), first, the rotation motor 72 of the cover body moving mechanism 7 is driven, and the cover body 6 located at the retreat position is pivoted horizontally to be located at the upper position. Then, the cylinder 73 of the cover body moving mechanism 7 is driven to lower the cover body 6 located at the upper position to the lower position, and the substrate W is covered with the cover body 6. Thus, the space around the substrate W is blocked. In this way, the upper surface Sw of the substrate W held by the substrate holder 52 is covered with the cover body 6 located at the lower position (i.e., the processing position).

After the substrate W is covered with the cover body 6, the inert gas is discharged from the gas supply opening 13 of the gas supply nozzle 12 in the state where the plating liquid L1 is placed on the upper surface Sw of the substrate W. Thus, the inert gas is supplied to the space between the substrate W held by the substrate holder 52 and the cover body 6 located at the lower position (S6), so that the plating processing can be performed on the upper surface Sw of the substrate W while the space around the substrate W is maintained in the low oxygen atmosphere.

Then, the plating liquid L1 accumulated on the substrate W is heated (S7). When the temperature of the plating liquid L1 increases to a temperature at which the component in the plating liquid L1 is precipitated, the component of the plating liquid L1 is precipitated on the upper surface of the substrate W to form and grow the plating film. In this heating process, the plating liquid L1 is heated to be maintained at the precipitation temperature for the time required for obtaining the plating film having the desired thickness.

When the heating process is ended, the cover body moving mechanism 7 is driven to locate the cover body 6 at the retreat position (S8). Thus, the plating liquid heating process (S5 to S8) on the substrate W is ended.

Then, the rinsing processing is performed on the substrate W (S9). In this rinsing processing, first, the rotational speed of the substrate W is increased higher than the rotational speed in the plating processing. For example, the substrate W is rotated at the same rotational speed as in the substrate rinsing process S3 performed before the plating processing. Subsequently, the rinse liquid nozzle 551 located at the retreat position is moved to the discharge position. Thereafter, the rinse liquid L3 is supplied from the rinse liquid nozzle 551 onto the substrate W being rotated. Thus, the surface of the substrate W is cleaned, and the plating liquid L1 remaining on the substrate W is washed away.

Subsequently, a drying processing is performed on the substrate W (S10). In this dry processing, the substrate W is rotated at a high speed. For example, the rotational speed of the substrate W is increased higher than the rotational speed in the substrate rinsing processing S9. Accordingly, the rinse liquid L3 remaining on the substrate W is scattered off to be removed, and the substrate W with the plating film thereon is obtained. In this case, the inert gas such as the nitrogen ($N_2$) gas may be discharged onto the substrate W to facilitate the drying of the substrate W.

Then, the substrate W is taken out from the substrate holder 52 and carried out from the plating device 5 (S11).

As described above, according to the plating method of the present example, the upper surface Sw of the substrate W on which the plating liquid L1 is placed is covered with the cover body 6, and the inert gas is discharged from the gas supply opening 13 of the gas supply nozzle 12 (S6). In this inert gas supplying process S6, the opening direction of the gas supply opening 13 is directed to the direction other than the upper surface Sw of the substrate W held by the substrate holder 52. Accordingly, the inert gas can be supplied to the space between the substrate W and the cover body 6 while suppressing the temperature decrease of the plating liquid L1 and suppressing the state turbulence of the plating liquid L1. Thus, it is possible to stably perform the liquid processing on the substrate W.

In view of suppressing the oxidation of the plating liquid L1, it is desirable to set the space around the upper surface Sw of the substrate W to be in the low oxygen atmosphere as soon as possible after the plating liquid L1 is placed on the substrate W. In view of improving the quality of the plating processing on the substrate W, it is desirable to suppress the influence of the inert gas discharged from the gas supply opening 13 on the plating liquid L1 on the substrate W. Therefore, as shown in FIG. 7, it is possible to discharge the inert gas from the gas supply opening 13 at various timings.

For example, the inert gas may be discharged from the gas supply opening 13 of the gas supply nozzle 12 before the cover body 6 is located at the lower position (see, for example, S12-1 in FIG. 7). In this case, prior to the inert gas supplying process S6, the inert gas may be gathered in the space defined by the ceiling member 61 and the sidewall member 62 (i.e., the inside space of the cover body 6) before the cover body 6 is located at the lower position.

Further, the inert gas may be discharged from the gas supply opening 13 of the gas supply nozzle 12 in the state where the cleaning liquid L2 is placed on the upper surface Sw of the substrate W (see, for example, S12-2 in FIG. 7). Accordingly, during the substrate cleaning process S2 prior to the inert gas supplying process S6, the inert gas can be gathered in the inside space of the cover body 6.

Furthermore, the inert gas may be discharged from the gas supply opening 13 of the gas supply nozzle 12 and gathered in the space defined by the ceiling member 61 and the sidewall member 62 before the cleaning liquid L2 is supplied onto the upper surface Sw of the substrate W (see, for example, S12-3 in FIG. 7). Accordingly, before the substrate cleaning process S2 prior to the inert gas supplying process S6, the inert gas can be gathered in the inside space of the cover body 6.

Also, the inert gas may be discharged from the gas supply opening 13 of the gas supply nozzle 12 before the rinse liquid L3 is supplied onto the substrate W (i.e., between the substrate cleaning process S2 and the substrate rinsing process S3). Further, the inert gas may be discharged from the gas supply opening 13 of the gas supply nozzle 12 before the plating liquid L1 is supplied onto the substrate W (i.e., between the substrate rinsing process S3 and the plating liquid accumulating process S4).

Since the inert gas is gathered in the inside space of the cover body 6 prior to the inert gas supplying process S6 as described above, the space around the substrate W can be rapidly set in the low oxygen atmosphere in the inert gas supplying process S6. In order to gather the inert gas in the inside space of the cover body 6 for a long time, the inert gas is desirably light. For example, helium can be appropriately used as the inert gas.

The discharge of the inert gas from the gas supply opening 13 of the gas supply nozzle 12 may be performed intermittently or continuously before the inert gas supplying process (see S1 to S5) and during the inert gas supplying process S6.

The inert gas may be discharged from the gas supply opening 13 of the gas supply nozzle 12 before the cover body 6 is located at the lower position and while the cover body 6 located at the lower position covers the upper surface Sw of the substrate W. In this case, the inert gas whose flow rate is higher than that of the inert gas discharged from the gas supply opening 13 while the cover body 6 is located at the lower position can be discharged from the gas supply opening 13 before the cover body 6 is located at the lower position. Before the cover body 6 is located at the lower position, the gas supply nozzle 12 provided at the cover body 6 is located far from the upper surface Sw of the substrate W. Therefore, even when the inert gas is discharged at a high flow rate from the gas supply opening 13, the plating liquid L1 on the substrate W is less influenced by the inert gas. Meanwhile, while the cover body is located at the lower position, the gas supply nozzle 12 is located near the substrate W. Therefore, it is possible to reduce the flow rate of the inert gas discharged from the gas supply opening 13 and thus suppress the influence of the inert gas on the plating liquid L1 on the substrate W. By changing the discharge flow rate of the inert gas before and after the cover body 6 is located at the lower position as described above, it is possible to rapidly supply the required amount of the inert gas to the space between the substrate W and the cover body 6 while suppressing the influence of the inert gas on the plating liquid L1 on the substrate W.

Further, inert gas may be discharged from the gas supply opening 13 of the gas supply nozzle 12 while the cleaning liquid L2 is placed on the upper surface Sw of the substrate W and while the plating liquid L1 is placed on the upper surface Sw of the substrate W. In this case, the inert gas whose flow rate is higher than that of the inert gas discharged from the gas supply opening 13 while the plating liquid L1 is placed on the upper surface Sw of the substrate W can be discharged from the gas supply opening 13 while the cleaning liquid L2 is placed on the upper surface Sw of the substrate W. In the plating processing on the substrate W, even if the state of the cleaning liquid L2 on the substrate W is turbulent, the influence is substantially small, but the state turbulence of the plating liquid L1 on the substrate W may cause the relatively large influence on the quality of the plating processing. Therefore, in the substrate cleaning process S2, the inert gas is discharged from the gas supply opening at a high flow rate to scatter the cleaning liquid L2 on the substrate W, and, thus, it is possible to rapidly supply the inert gas to the inside space of the cover body 6. Meanwhile, in the inert gas supplying process S6, the inert gas is discharged from the gas supply opening 13 at a low flow rate, and, thus, it is possible to supply the inert gas to the space between the substrate W and the cover body 6 without the state turbulence of the plating liquid L1 on the substrate W. By changing the discharge flow rate of the inert gas in the substrate cleaning process and the inert gas supplying process as described above, it is possible to rapidly supply the required amount of the inert gas to the space between the substrate W and the cover body 6 while suppressing the influence of the inert gas on the plating liquid L1 on the substrate W.

Further, water vapor in addition to the inert gas may be discharged from the gas supply opening 13 of the gas supply nozzle 12. While the cover body 6 located at the lower position covers the plating liquid L1 on the upper surface Sw of the substrate W, the gas supply opening 13 may supply a mixed gas of the inert gas and the water vapor to the space between the substrate W and the cover body 6. In this case, vaporization of the plating liquid Lion the substrate W can be suppressed. Thus, it is possible to suppress the decrease in the amount of the plating liquid L1. Also, it is possible to suppress the temperature decrease of the plating liquid L1 caused by the vaporization. The method of producing the mixed gas containing the inert gas and the water vapor is not limited. For example, the mixed gas containing the inert gas and the water vapor may be produced by bubbling with the inert gas in a pure water tank (not shown) that stores pure water (i.e., by allowing the inert gas to pass through the pure water). The mixed gas may also be produced by heating the pure water in the pure water tank to produce the water vapor and then mixing the water vapor with the inert gas.

The present disclosure is not limited to the above-described exemplary embodiments and modification examples, and constituent elements can be modified and changed in an embodiment within the scope of the present disclosure. Further, the constituent elements described in the above exemplary embodiments and modification examples can be combined appropriately to form various apparatuses and methods. Some constituent elements may be removed from all the constituent elements shown in the exemplary embodiments and modification examples. Also, the constituent elements in different exemplary embodiments and modification examples may be combined appropriately.

For example, the substrate liquid processing apparatus and the substrate liquid processing method according to the present disclosure are effective for a processing liquid other than the plating liquid L1 and a liquid processing other than the plating processing. The present disclosure may be embodied by a recording medium (for example, the recording medium 31) storing therein the program that, when executed by the computer for controlling the operation of the substrate liquid processing apparatus, causes the computer to control the substrate liquid processing apparatus to perform the above-described substrate liquid processing method.

According to the present disclosure, it is possible to stably perform the liquid processing on the substrate while supplying the inert gas around the substrate.

We claim:

1. A substrate liquid processing apparatus, comprising:

a substrate holder configured to hold a substrate;

a plating liquid supply configured to supply a plating liquid to an upper surface of the substrate held by the substrate holder;

a cover body that is raised or lowered by a cylinder, the cover body configured to cover the upper surface of the substrate held by the substrate holder;

a gas supply nozzle having a gas supply opening through which an inert gas is discharged;

a controller configured to control the cylinder and the gas supply nozzle;

a cup disposed around the substrate holder and configured to receive the plating liquid scattered from the substrate; and an atmosphere blocking cover provided on an outer periphery side of the cup in order to suppress diffusion of an atmosphere around the substrate into a chamber, wherein the atmosphere blocking cover is formed in a cylindrical shape so as to extend higher than the cup in a vertical direction, and has an open upper end, wherein an opening direction of the gas supply opening is directed to a direction other than the upper surface of the substrate held by the substrate holder, wherein the cover body has a ceiling member extended horizontally, and a sidewall member extended downward from the ceiling member, the cover body forming an open space between the ceiling member, the sidewall and the substrate held by the substrate holder, the open space facing the upper surface of the substrate, wherein the controller is further configured to control the cylinder to lower the cover body from an upper position to a lower position, and at the lower position, the cover body covers the upper surface of the substrate and blocks a space around the substrate, wherein, when the cover body is at the lower position, the controller is further configured to control the gas supply nozzle to discharge the inert gas at a second flow rate that suppresses turbulence in the plating liquid on the substrate, wherein while the cover body is located higher than the cup, creating a vertical gap between the cover body and the cup that permits a gas from outside of the cup to flow into the open space, the controller is further configured to control the gas supply nozzle to discharge the inert gas from the gas supply opening of the gas supply nozzle to the open space at a first flow rate, such that the inert gas is gathered in the open space while the cover body does not block the space around the substrate before the cover body is located at the lower position, wherein the controller is further configured to control the plating liquid supply, the cylinder, and the gas supply nozzle, thereby executing;

(a) discharging the plating liquid to the upper surface of the substrate from the plating liquid supply, while the cover body is located higher than the cup;

(b) after (a), while the cover body is located higher than the cup, discharging the inert gas from the gas supply opening of the gas supply nozzle into the open space at the first flow rate; and (c) after (b), lowering the cover body to the lower position, and when the cover body is located at the lower position, discharging the inert gas at the second flow rate lower than the first flow rate to suppress the turbulence in the plating liquid on the substrate.

2. The substrate liquid processing apparatus of claim 1, wherein the cover body further comprises a heater provided in the ceiling member and configured to generate heat.

3. The substrate liquid processing apparatus of claim 2, wherein the gas supply nozzle is provided at the ceiling member.

4. The substrate liquid processing apparatus of claim 2, wherein the opening direction is directed to the ceiling member.

5. The substrate liquid processing apparatus of claim 2, further comprising:

an airflow guide member having a guide surface exposed to the open space and provided at a corner between the ceiling member and the sidewall member, wherein the opening direction is directed to the guide surface.

6. The substrate liquid processing apparatus of claim 2, further comprising:

a flange extended from the sidewall member toward a side of the substrate holder.

7. The substrate liquid processing apparatus of claim 1, wherein the opening direction is a horizontal direction.

8. The substrate liquid processing apparatus of claim 1, wherein the opening direction is directed from an outer peripheral side of the substrate toward an inside of the substrate.

9. The substrate liquid processing apparatus of claim 1, wherein the opening direction is directed from an inside of the substrate toward an outer peripheral side of the substrate.

10. The substrate liquid processing apparatus of claim 1, wherein the gas supply opening includes multiple gas supply openings, the substrate holder rotates the substrate around a rotation axis in a forward circumferential direction, two or more extension lines which respectively pass through centers of two or more gas supply openings of the multiple gas supply openings and which are respectively extended linearly in opening directions of the two or more gas supply openings do not pass through the rotation axis, and the opening directions of the two or more gas supply openings are set to follow one of the forward circumferential direction and a reverse circumferential direction opposite to the forward circumferential direction.

11. The substrate liquid processing apparatus of claim 10, wherein the opening directions of the two or more gas supply openings are set to follow the forward circumferential direction.

12. The substrate liquid processing apparatus of claim 1, wherein the inert gas is helium.

* * * * *